United States Patent [19]

Akiba et al.

[11] Patent Number: 5,703,825

[45] Date of Patent: Dec. 30, 1997

[54] SEMICONDUCTOR INTEGRATED CIRCUIT DEVICE HAVING A LEAKAGE CURRENT REDUCTION MEANS

[75] Inventors: Takesada Akiba, Tachikawa; Goro Kitsukawa, Hinode-machi, both of Japan

[73] Assignee: Hitachi Ltd., Tokyo, Japan

[21] Appl. No.: 785,417

[22] Filed: Jan. 23, 1997

Related U.S. Application Data

[60] Provisional application No. 60/010,073 Jan. 30, 1996.

[51] Int. Cl.$^6$ .................................................. G11C 7/00
[52] U.S. Cl. .................... 365/229; 365/168; 365/189.09; 365/189.11; 365/230.06
[58] Field of Search ........................ 365/230.06, 229, 365/168, 189.09, 189.11

[56] References Cited

U.S. PATENT DOCUMENTS

| | | |
|---|---|---|
| 5,272,676 | 12/1993 | Kubono et al. . |
| 5,274,601 | 12/1993 | Kawahara et al. . |
| 5,408,144 | 4/1995 | Sakata et al. . |
| 5,426,326 | 6/1995 | Ohyu et al. . |
| 5,463,588 | 10/1995 | Chonan .................. 365/189.09 |
| 5,490,117 | 2/1996 | Oda et al. ................. 365/229 |
| 5,521,527 | 5/1996 | Sakata et al. . |
| 5,541,885 | 7/1996 | Takashima ............... 365/229 |

*Primary Examiner*—Joseph E. Clawson, Jr.
*Attorney, Agent, or Firm*—Haynes and Boone, L.L.P.

[57] ABSTRACT

A circuit and method for reducing the leakage current drawn by a transistor when it is inactive. In a first implementation, a circuit selectively drives the gate of a transistor to a voltage level above a source voltage. As a result, the gate-source voltage is reversed and the leakage current flowing through the transistor is substantially reduced. In a second implementation, a circuit selectively biases the well of a transistor to a voltage level above a normal bias voltage. As a result, the voltage-current characteristics of the transistor are modified so that the leakage current is substantially eliminated.

21 Claims, 2 Drawing Sheets

SEMICONDUCTOR INTEGRATED CIRCUIT DEVICE HAVING A LEAKAGE CURRENT REDUCTION MEANS

CROSS REFERENCE

This application claims the benefit of U.S. Provisional Application Ser. No. 60/010,073, filed Jan. 30, 1996.

BACKGROUND OF THE INVENTION

The present invention relates generally to semiconductor design technology, and more particularly, to a system and method for reducing leakage current in a semiconductor circuit.

Due to many technological advances, integrated circuits, or "chips," incorporate many millions of transistors on a single monolithic device. This provides many advantages, including increased speed and reduced size, but the current drawn by each transistor becomes more of a problem as the number of transistors on a single chip increases. The problem is somewhat alleviated by the fact that all of the transistors on a single chip are never simultaneously active, and theoretically, a transistor only draws current while it is active. However, a transistor does draw a small leakage current while it is inactive. Although the magnitude of the leakage current for a single transistor is typically on the order of a few pico-amperes, due to the large number of transistors on a single chip, the few pico-amperes per inactive transistor becomes a significant amount.

For example, FIGS. 1a and 1b illustrate a conventional p-channel metal oxide semiconductor ("PMOS") transistor 10a and a corresponding voltage-current graph 10b. The transistor 10a has a gate G, a source S, a drain D, and a well W. The well W is typically biased to the same voltage applied to the source S. The transistor 10a is activated by forming a p-channel (not shown) of minority carriers in the well W between a source-drain junction (not shown) when a voltage $V_{GS}$ is applied to the transistor.

In operation, if the voltage $V_{GS}$ is negative, the transistor 10a is active and draws a drain current $I_D$ as shown in the graph 10b. If the voltage $V_{GS}$ is equal to 0V, the transistor 10a is inactive and the drain current $I_D$ approaches 0 amps. However, the drain current $I_D$ does not quite reach 0 amps because the transistor 10a still draws a very small leakage current $I_{LK}$, which flows across the drain-source junction due to the minority carriers still located in the p-channel.

Therefore, what is needed is a circuit and method for enabling a transistor to operate in a mode in which the leakage current drawn by the transistor is significantly reduced.

SUMMARY OF THE INVENTION

The present invention, accordingly, provides a circuit and method for reducing the leakage current drawn by a transistor while it is inactive. In a first implementation, a circuit selectively drives the gate of the transistor to a voltage level above a source voltage. As a result, the gate-source voltage is reversed and leakage current flowing through the transistor is substantially reduced. In a second implementation, a circuit selectively biases the well of the transistor to a voltage level above a normal bias voltage. As a result, the voltage-current characteristics of the transistor are modified so that leakage current is substantially eliminated.

A technical advantage achieved with the present invention is that it enables a transistor to operate in a normal mode, with typical voltage-current characteristics, or in a standby mode, with a significantly reduced leakage current.

BRIEF DESCRIPTION OF THE DRAWINGS

FIG. 1b is a voltage-current graph of the transistor of FIG. 1a.

DETAILED DESCRIPTION OF THE PREFERRED EMBODIMENT

Figure 1A:
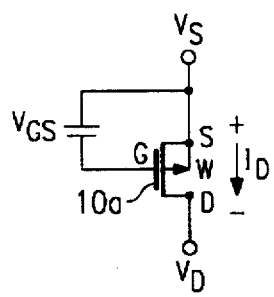
FIG. 1a is a schematic diagram of a conventional transistor.

As described above, FIGS. 1a and 1b respectively illustrate a conventional transistor and its voltage and current characteristics. The description below utilizes conventional transistors, such as the transistor 10a, and therefore the individual components and characteristics of the transistor 10a are used and referenced by the description of the preferred embodiment.

The different implementations of the present invention utilize several conventional voltages, including a first positive power supply ($V_{PERI}$), a second positive power supply ($V_{PP}$), a negative power supply ($V_{BB}$) and a ground level power supply ($V_{SS}$) such that $V_{BB} < V_{SS} < V_{PERI} < V_{PP}$. For the sake of example, $V_{BB}$, $V_{SS}$, $V_{PERI}$, and $V_{PP}$ will be deemed to be $-1V$, $0V$, $2.5V$ and $3.6V$, respectively. Furthermore, each implementation utilizes several signals, including an input signal IN, a standby signal STB, and an output signal OUT.

Figure 2:
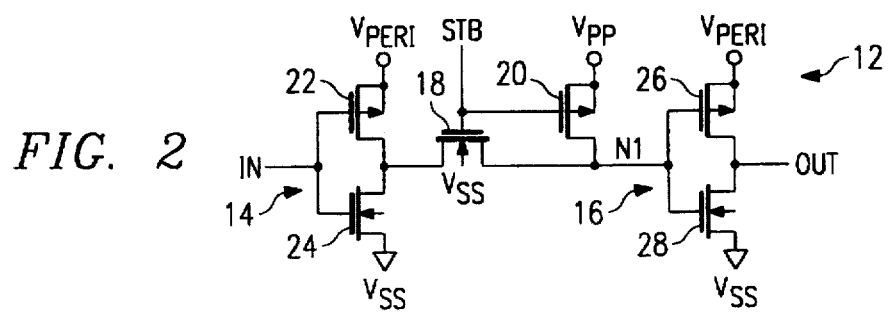
FIG. 2 is a schematic diagram of a circuit embodying a first implementation of the present invention.

Referring to FIG. 2, the reference numeral 12 designates, in general, a first implementation of an integrated circuit embodying features of the present invention. The circuit 12 includes two inverters 14, 16, and two switch transistors: a pass transistor 18 and a standby transistor 20. The inverter 14 comprises a p-channel metal oxide semiconductor ("PMOS") transistor 22 and an n-channel metal oxide semiconductor ("NMOS") transistor 24 and the inverter 16 comprises a PMOS transistor 26 and an NMOS transistor 28. Furthermore, all of the NMOS transistors 18, 24, 28 have a $V_{SS}$-biased well, one PMOS transistor 20 has a $V_{PP}$-biased well, and two PMOS transistors 22, 26 have a $V_{PERI}$-biased well.

Figure 1B:
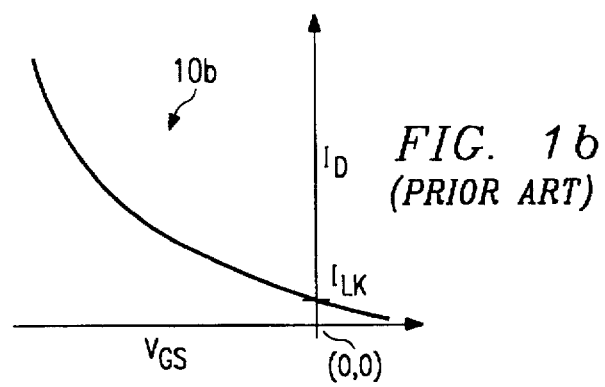

In operation, when the standby signal STB is "high", e.g., near $V_{PP}$, the circuit 12 is in a normal mode and operates as a conventional driver. The signal received at the input signal IN is inverted by the inverter 14, passed through the pass transistor 18, inverted again by the inverter 16, and driven at the output signal OUT. However, when the standby signal STB is "low", e.g., near $V_{SS}$, the circuit 12 enters a standby mode. Because the standby signal STB is low, the pass transistor 18 becomes inactive and the standby transistor 20 becomes active. When this happens, an input N1 of the inverter 16 is pulled high to the $V_{PP}$ voltage level (3.6V). As a result, the voltage $V_{GS}$ of the transistor 26 becomes positive, due to the voltage at the gate of the transistor 26 being greater than the voltage at the source, reducing the number of minority carriers in the channel in the source-drain junction of the transistor and thereby reducing the leakage current ("ILK") through the transistor as shown in FIG. 1b.

Figure 3:
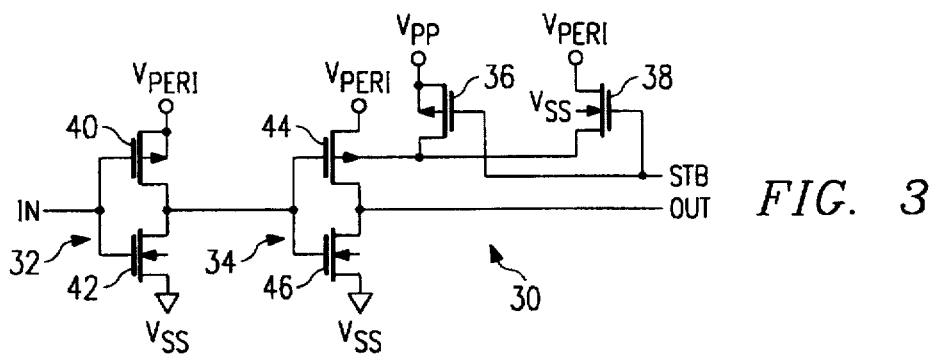
FIG. 3 is a schematic diagram of a circuit embodying a second implementation of the present invention.

Referring to FIG. 3, the reference numeral 30 designates, in general, to a second implementation of an integrated circuit embodying features of the present invention. The circuit 30 includes two inverters 32, 34, and two well-biased transistors 36, 38. The inverter 32 comprises a PMOS transistor 40 and an NMOS transistor 42 and the inverter 34 comprises a PMOS transistor 44 and an NMOS transistor 46. Furthermore, all of the NMOS transistors 38, 42, 46 have a Vss-biased well, the PMOS transistors 36 has a VPP-biased well, and the PMOS transistors 40 has a VPERI-biased well. The well of the PMOS transistor 44 is connected to the drains of the two well-biased transistors 36, 38, which have their sources connected to VPERI and VPP, respectively.

In operation, when the standby signal STB is high (near VPP), the circuit 30 is in a normal mode and operates as a conventional driver. The signal received at the input signal IN is inverted by the inverter 32, is inverted again by the inverter 34, and is driven at the output signal OUT. Because the standby signal STB is high, the well-biased transistor 36 is inactive and the well-biased transistor 38 is active. As a result, the well of the PMOS transistor 44 is biased to VPERI (2.5V) and performs in a normal, conventional manner. However, when the standby signal STB is low (near VSS), the circuit 30 enters a standby mode. In the standby mode, the well-biased transistor 38 is inactive and the well-biased transistor 36 is active. As a result, the well of the PMOS transistor 44 is biased to VPP (3.6V) and performs in a different manner, as described below.

Figure 4:
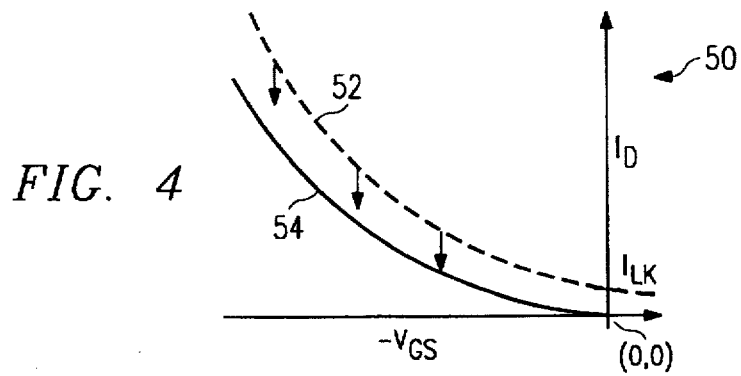
FIG. 4 is a graph of a voltage-current characteristic of a transistor of the circuit of FIG. 3.

Referring to FIG. 4, the graph 50 includes a dotted line 52, which represents the voltage-current characteristics of the VPERI-well-biased transistor 44, just like the conventional transistor 10a of FIG. 1, and a solid line 54, which represents the voltage-current characteristics of the VPP-well-biased transistor 44 of FIG. 3. By applying the bias voltage VPP (3.6V) to the well of the transistor 44, the well is biased above the source voltage of the transistor, which is at the VPERI voltage level. As a result, the voltage-current characteristics of the transistor 44 are offset from the conventional characteristics shown by the dotted line 52. Due to this offset, when the voltage VGS equals 0V, the corresponding leakage current ILK is significantly reduced.

Figure 5:
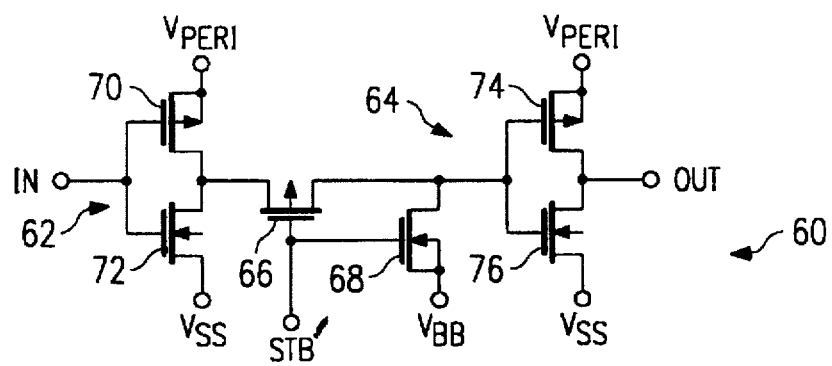
FIG. 5 is a schematic diagram of a circuit embodying a third implementation of the present invention.

Referring to FIG. 5, the reference numeral 60 designates, in general, a third implementation of an integrated circuit embodying features of the present invention. The circuit 60 includes two inverters 62, 64, and two switch transistors: a pass transistor 66 and a standby transistor 68. In addition, the circuit 60 uses a negative standby signal STB'. The inverter 62 includes a PMOS transistor 70 and an NMOS transistor 72 and the inverter 64 comprises a PMOS transistor 74 and an NMOS transistor 76. Furthermore, all of the PMOS transistors 66, 70, 74 have a VPERI-biased well, one NMOS transistor 68 has a VBB-biased well, and two NMOS transistors 72, 76 have a VSS-biased well.

In operation, the circuit 60 behaves in a negative manner, as compared to the circuit 12 (FIG. 2). Instead of having the output signal OUT fixed low (near VSS) during the standby state, it is fixed high (near VPERI). When the standby signal STB' is low (near VBB), the circuit 60 is in a normal mode and operates as a conventional driver. The signal received at the input signal IN is inverted by the inverter 62, is inverted again by the inverter 64, and is driven at the output signal OUT. During the standby state, the standby signal STB' is high (near VPERI) so that the circuit 60 enters a standby mode. In the standby mode, the well-biased transistor 68 is inactive and the well-biased transistor 66 is active. As a result, the well of the NMOS transistor 74 is biased to VBB (−1V) and the corresponding leakage current is sufficiently reduced, similar to the result of circuit 12 described above in FIG. 4.

Figure 6:
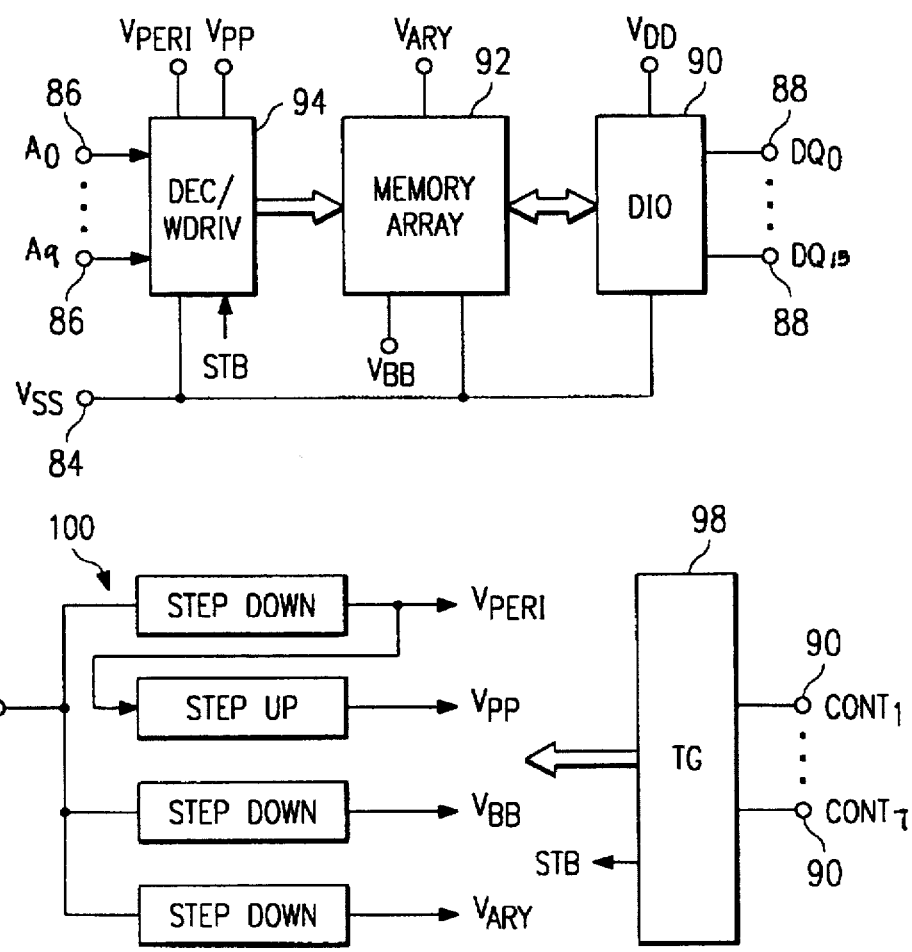
FIG. 6 is a block diagram of a dynamic random access memory utilizing one of the circuit implementations of FIGS. 2, 3, or 5.

Referring to FIG. 6, the implementations of FIGS. 2, 3 and 5 can be readily utilized by a dynamic random access memory ("DRAM") 80. The DRAM 80 is configured on a single silicon substrate using a conventional complimentary metal oxide semiconductor fabrication technique. The DRAM 80 receives the two external voltages, VDD and VSS, through terminals 82 and 84, respectively, such that VDD equals 3.3V and VSS equals 0V. The DRAM 80 has additional terminals 86, 88 and 90 for receiving address signals A0–A9, data signals DQ0–DQ15, and control signals CONT0–CONT7, respectively. It is understood that the voltages and signals are described for the sake of example, and are not intended to limit the invention.

The DRAM 80 includes a memory array 92, which is a conventional memory array including word lines, data lines and memory cells. Likewise, the DRAM 80 includes several peripheral circuits such as decoder and word line driver (DEC/WDRIV) circuits 94, data input/output (DIO) circuits 96, and timing and control signal generator (TG) circuits 98. For reasons beyond the scope of the present invention but well understood in the art, the memory array 92 utilizes the voltages VBB and VARY and the DEC/WDRIV circuits 94 utilize the voltages VPERI and VPP such that VBB, VARY, VPERI, and VPP equal −1.0V, 2.0V, 2.5V and 3.6V, respectively. One or more of the circuits 12, 30, 60 (FIGS. 2, 3, 5, respectively) are utilized in the DEC/WDRIV circuits 94.

The voltages VBB, VARY, VPERI, and VPP are generated from the external voltage VDD and VSS by a voltage circuit 100, which includes several step-down and step-up circuits. In addition, the standby signal STB is generated, along with many other conventional control signals, by the TG circuit 98. It is understood that methods for creating such internal voltages and signals is well known in the art. The standby signal STB is then supplied to the DEC/WDRIV circuit 94 to be used as described above with reference to FIGS. 2, 3, or 5.

Although illustrative embodiments of the present invention have been shown and described, a latitude of modification, change and substitution is intended in the foregoing disclosure, and in certain instances, some features of the invention will be employed without a corresponding use of other features. For example, the leakage current reduction scheme can be implemented in a register or a buffer, and is described with a driver only for ease of description. Furthermore, NMOS transistors also draw a leakage current and would benefit from application of the present invention. Finally, additional or alternative components and other circuits may be added without altering the scope of the invention. Accordingly, it is appropriate that the appended claims be construed broadly and in a manner consistent with the scope of the invention.

What is claimed is:

1. An output circuit comprising:

a first terminal for receiving a positive power supply voltage;

a second terminal for receiving a negative power supply voltage; and a first inverter comprising a PMOS transistor and an NMOS transistor connected in series between said first and second terminals;

wherein, in a normal mode, an input signal to said first inverter, supplied to gates of said PMOS and NMOS transistors, has a first voltage level corresponding to said negative power supply voltage and a second voltage level corresponding to said positive power supply voltage, and wherein, in a standby mode, said input signal to said first inverter has a third voltage level being higher than the level of said positive power supply voltage.

2. An output circuit according to claim 1, further comprising:
a second inverter;
a third terminal for receiving a voltage having said third voltage level;
a pass transistor having a source-drain path provided between an output terminal of said second inverter and an input terminal of said first inverter; and
a standby transistor having a source-drain path provided between an input terminal of said first inverter and said third terminal;
wherein, in said normal mode, said pass transistor is active and said standby transistor is inactive, and
wherein, in said standby mode, said pass transistor is inactive and said standby transistor is active.

3. An output circuit comprising:
a first terminal for receiving a positive power supply voltage;
a second terminal for receiving a negative power supply voltage; and
an inverter comprising a PMOS transistor and an NMOS transistor connected in series between said first and second terminals,
wherein, in a normal mode, a first voltage level corresponding to said power supply voltage is applied to a well of said PMOS transistor, and
wherein, in a stand-by mode, a second voltage level is applied to said well of said PMOS transistor, said second voltage level being higher than a level of said positive power supply voltage.

4. A circuit for reducing leakage current in a transistor, the circuit comprising an output transistor having a gate connected to an input of the circuit, a drain connected to an output of the circuit and a source connected to a first power supply, and means for selectively disconnecting the gate from the input and connecting the gate to a second power supply, wherein a voltage level of the second power supply is greater than a voltage level of the first power supply.

5. The circuit of claim 4 wherein the means for selectively connecting and disconnecting comprises a PMOS transistor connected between the gate and the second power supply and an NMOS transistor connected between the gate and the input.

6. A method for selectively switching a PMOS transistor between a normal mode in which the PMOS transistor operates in a conventional manner and a standby mode in which a leakage current of the PMOS transistor is significantly reduced, the method comprising selectively connecting a gate of the PMOS transistor to a power supply having a voltage level that is greater than a source voltage of the PMOS transistor.

7. The method of claim 6 wherein in the normal mode, the gate of the PMOS transistor is connected to an input signal operating at a voltage level less than or equal to the source voltage of the PMOS transistor.

8. A method for selectively switching an NMOS transistor between a normal mode wherein the NMOS transistor operates in a conventional manner and a standby mode wherein a leakage current of the NMOS transistor is significantly reduced, the method comprising selectively connecting a gate of the transistor to a power supply having a voltage level that is less than a source voltage of the NMOS transistor.

9. The method of claim 8 wherein in the normal mode, the gate of the NMOS transistor is connected to an input signal operating at a voltage level greater than or equal to the source voltage of the NMOS transistor.

10. A circuit for reducing leakage current in a transistor, the circuit comprising an output transistor having a gate connected to an input of the circuit, a drain connected to an output and a source connected to a first power supply, and means for selectively connecting a well of the output transistor to either the first power supply or a second power supply, wherein a voltage level of the second power supply is greater than a voltage level of the first power supply.

11. The circuit of claim 10 wherein the means for selectively connecting comprises a first well-biased transistor and a second well-biased transistor wherein the first well-biased transistor connects the well of the output transistor to the first power supply and the second well-biased transistor connects the well of the output transistor to the second power supply.

12. A method for selectively switching an output transistor between a normal mode wherein the output transistor operates in a conventional manner and a standby mode wherein a leakage current through the output transistor is reduced comprising selectively connecting a well of the output transistor between two separate power supplies.

13. The method of claim 12 wherein the step for selectively connecting comprises activating either a first well-biased transistor connected in series between the well of the output transistor and the first power supply or activating a second well-biased transistor connected in series between the well of the output transistor and the second power supply.

14. A semiconductor memory comprising:
a memory array;
a peripheral circuit coupled to said memory array; and
a step-up circuit generating a second power-supply voltage higher than a first power-supply voltage,
wherein said peripheral circuit includes an output transistor having a gate coupled to an input terminal, a drain coupled to an output terminal and a source receiving said first power-supply voltage and a switch circuit which supplies said second power-supply voltage to said gate with said gate disconnected from said input terminal.

15. A semiconductor memory according to claim 14, wherein a high level of an input signal supplied to said input terminal corresponds to a level of said first power-supply voltage.

16. A semiconductor memory according to claim 15, wherein said peripheral circuit is a decoder which generates a select signal for the above memory array by receiving address signals.

17. A semiconductor memory comprising:
a memory array;
a decoder coupled to said memory array;
a control circuit which outputs a control signal to indicate whether said decoder is in either normal operation state or stand-by state; and
a step-up circuit which generates a second power-supply voltage hither than a first power-supply voltage, wherein said decoder comprises an output circuit having a PMOS transistor with a gate coupled to an input terminal, a drain coupled to an output terminal and a source receiving said first power-supply voltage and a switch circuit which supplies said second power-supply voltage to said gate with said gate disconnected from said input terminal.

18. A semiconductor memory according to claim 17, further comprising a NMOS transistor having a gate coupled to said input terminal, a drain coupled to said output terminal and a source receiving a ground-level voltage.

19. A semiconductor memory according to claim 18, wherein said switch circuit comprises a first switch transistor having a source-drain path provided between the common gate of said NMOS transistor and PMOS transistor and said input terminal and a second switch transistor having a source-drain path provided between said common gate and a terminal receiving said second power-supply terminal.

20. A semiconductor memory according to claim 19, wherein said first switch transistor is an NMOS transistor, said second switch transistor is a PMOS transistor, and said control signal is applied to the common gate of said first and second switch transistors.

21. A semiconductor memory according to claim 19, wherein a high level of an input signal applied to said input terminal corresponds to a level of said first power-supply voltage, and a low level of an input signal corresponds to said ground-level voltage.

* * * * *